United States Patent
Chang et al.

(10) Patent No.: US 10,886,944 B2
(45) Date of Patent: Jan. 5, 2021

(54) LOW-DENSITY PARITY-CHECK CODE SCALING METHOD

(71) Applicant: NATIONAL CHIAO TUNG UNIVERSITY, Hsinchu (TW)

(72) Inventors: Hsie-Chia Chang, Hsinchu (TW); Yen-Chin Liao, Hsinchu (TW); Shu Lin, Milpitas, CA (US)

(73) Assignee: NATIONAL CHIAO TUNG UNIVERSITY, Hsinchu (TW)

(*) Notice: Subject to any disclaimer, the term of this patent is extended or adjusted under 35 U.S.C. 154(b) by 72 days.

(21) Appl. No.: 16/139,471

(22) Filed: Sep. 24, 2018

(65) Prior Publication Data

US 2020/0099394 A1   Mar. 26, 2020

(51) Int. Cl.
*H03M 13/00* (2006.01)
*H03M 13/11* (2006.01)
*H03M 13/15* (2006.01)

(52) U.S. Cl.
CPC ...... *H03M 13/112* (2013.01); *H03M 13/1137* (2013.01); *H03M 13/1185* (2013.01); *H03M 13/155* (2013.01); *H03M 13/616* (2013.01)

(58) Field of Classification Search
CPC . H04N 21/236; H04L 27/2627; H04L 1/0057; H04L 27/2647; H04L 27/2655; H04L 27/36; H04L 27/20; H04L 1/0071; H04L 27/3416; G06F 11/1076; H03M 13/1102; H03M 13/1165; H03M 13/255; H03M 13/618; H03M 13/2778; H03M 13/27; H03M 13/09; H03M 13/2792; H03M 13/036; H03M 13/616; H03M 13/116; H03M 13/1185; H03M 13/6555; H03M 13/2707; H03M 13/1134; H03M 13/1191; H03M 13/611; H03M 13/2906; H03M 13/1505; H03M 13/112; H03M 13/1137; H03M 13/155; G06N 7/005
See application file for complete search history.

(56) References Cited

U.S. PATENT DOCUMENTS

| | | | |
|---|---|---|---|
| 2011/0167315 A1* | 7/2011 | Kyung | H03M 13/1162 714/752 |
| 2011/0307754 A1* | 12/2011 | Sun | H03M 13/033 714/752 |
| 2018/0226992 A1* | 8/2018 | Panteleev | H03M 13/116 |

* cited by examiner

*Primary Examiner* — Guerrier Merant
(74) *Attorney, Agent, or Firm* — Muncy, Geissler, Olds & Lowe, P.C.

(57) ABSTRACT

A low-density parity-check code scaling method is disclosed. The method includes following steps: obtaining the original low-density parity-check matrix; forming the permutation matrices with the random row shift or the random column shift to the identity matrix; replacing the component codes by the permutation matrices and the all-zero matrix to form the extended low-density parity-check matrix; adjusting the code length and the code rate to form the global coupled low-density parity-check matrix; and outputting the global coupled low-density parity-check code.

6 Claims, 7 Drawing Sheets

$$H_0 = \begin{bmatrix} 0 & 0 & 0 & \cdots & 1 \\ 0 & 1 & 1 & \cdots & 1 \\ 1 & 0 & 1 & \cdots & 1 \end{bmatrix} \Big\} C_M$$

$\underbrace{\phantom{xxxxxxxx}}_{V_N}$ $$H_0 = \begin{bmatrix} \boxed{0} & 0 & 0 & \cdots & 1 \\ 0 & \boxed{1} & 1 & \cdots & 1 \\ \boxed{1} & 0 & 1 & \cdots & 1 \end{bmatrix}_{3 \times N}$$

$$H_1 = \begin{bmatrix} 0 & 0 & 0 & 0 & 0 & 0 & \cdots & 1 & 0 \\ 0 & 0 & 0 & 0 & 0 & 0 & \cdots & 0 & 1 \\ 0 & 0 & 0 & 1 & 0 & 1 & \cdots & 0 & 1 \\ 0 & 0 & 1 & 0 & 1 & 0 & \cdots & 1 & 0 \\ 1 & 0 & 0 & 0 & 1 & 0 & \cdots & 1 & 0 \\ 0 & 1 & 0 & 0 & 0 & 1 & \cdots & 0 & 1 \end{bmatrix}_{6 \times 2N}$$

$$B_0 = \begin{bmatrix} \beta^0 & \beta^1 & \beta^2 & \cdots & \beta^{12} \\ \beta^0 & \beta^2 & \beta^4 & \cdots & \beta^{11} \\ \beta^0 & \beta^3 & \beta^6 & \cdots & \beta^{10} \end{bmatrix}$$

$$A_0 = \begin{bmatrix} \beta^0 & 0 & \beta^1 & 0 & 0 & \beta^2 & \cdots & \beta^{12} & 0 \\ 0 & \beta^0 & 0 & \beta^1 & \beta^2 & 0 & \cdots & 0 & \beta^{12} \\ 0 & \beta^0 & \beta^2 & 0 & 0 & \beta^4 & \cdots & \beta^{11} & 0 \\ \beta^0 & 0 & 0 & \beta^2 & \beta^4 & 0 & \cdots & 0 & \beta^{11} \\ \beta^0 & 0 & 0 & \beta^3 & 0 & \beta^6 & \cdots & 0 & \beta^{10} \\ 0 & \beta^0 & \beta^3 & \beta^0 & \beta^6 & 0 & \cdots & \beta^{10} & 0 \end{bmatrix}$$

FIG. 6

LOW-DENSITY PARITY-CHECK CODE SCALING METHOD

BACKGROUND OF THE INVENTION

1. Field of the Invention

The present disclosure generally relates to a low-density parity-check (LDPC) code scaling method, and in particular, to the scaling method to construct large-block-length LDPC codes from short-block-length component codes, so as to design a structural block code of the LDPC matrix.

2. Description of the Related Art

The low-density parity-check (LDPC) code has been widely discussed, studied and incorporated into multiple systems due to its superior error correction capability and its parallel decoding characteristics. The trend of designing the low-density parity-check code is to provide the code with big block code. That is, the block code length is increased. For example, the communication system has used the big block LDPC code to encode and decode the transmitting data. The memory provider also uses the big block LDPC code to protect the data in the non-volatile memory such as NAND flash memory. The design of the block length may up to 4K byte or longer. According to the coding theory, it can be seen that the error correction capability of the block code increases with the block size. However, the hardware complexity of the encoders and the decoders may also increase accordingly.

To solve the problem of providing the desired block code length, the conventional method of adjusting the code length or the code rate includes shortening, puncturing and extension to the original LDPC code. Although the code length or the code rate of the mother code can be adjusted, the above methods are not able to increase the block code length. Whether it is used in communication systems or data storage systems, block code length is often added to define new system specifications to improve the quality and performance of information transmission. However, to redesign a new mother code usually takes times and the system development schedule may be delayed. In addition, the new design block code may not be compatible with the previous system.

In conclusion, the known technique of extending the block length of the low-density parity-check code indeed has the limitation and shortcomings. Hence, the inventor provides the scaling method of the low-density parity-check matrix and the base matrix to resolve the drawbacks so as to promote the industrial practicability.

SUMMARY OF THE INVENTION

In view of the aforementioned technical problems, one objective of the present disclosure provides a low-density parity-check code scaling method, which is capable of resolving the technical problem of adjusting the code length of the low-density parity-check matrix and the compatibility of the low-density parity-check matrix with large block length.

In accordance with one objective of the present disclosure, a low-density parity-check code scaling method is provided. The scaling method includes the following steps of: obtaining an original low-density parity-check matrix by an input device, the original low-density parity-check matrix includes a plurality of component codes consisted of ones and zeros; forming a plurality of permutation matrices by a processor, the plurality of permutation matrices are obtained by conducting a random row shift or a random column shift to an identity matrix; replacing the plurality of component codes by the processor to form an extended low-density parity-check matrix, the ones are replaced by the plurality of permutation matrices and the zeros are replaced by a all-zero matrix; adjusting a code length and a code rate of the extended low-density parity-check matrix by the processor and forming an global coupled low-density parity-check matrix; and outputting the global coupled low-density parity-check matrix by an output device.

Preferably, the random row shift may include a cyclic shift to each row with a predetermined number of rows, or the random column shift may include the cyclic shift to each column with a predetermined number of columns.

Preferably, the plurality of permutation matrices may include a fixed permutation matrix obtained by conducting a preset number row shift or a preset number column shift to the identity matrix, and the ones located in a predetermined block of the original low-density parity-check matrix are replaced by the fixed permutation matrix.

Preferably, the code length and the code rate may be adjusted by shortening the extended low-density parity-check matrix or puncturing the extended low-density parity-check matrix.

Preferably, the low-density parity-check matrix scaling method may further include the following step of: masking the extended low-density parity-check matrix by setting a part of the ones to zero.

In accordance with another objective of the present disclosure, a low-density parity-check code scaling method is disclosed. The scaling method includes the following steps of: obtaining an original base matrix by an input device, the original base matrix includes a plurality of component codes formed by a non-zero component and a zero component; forming a plurality of replacement matrices by a processor, the plurality of permutation matrices are obtained by conducting a random row shift or a random column shift to a diagonal matrix of the non-zero component; replacing the plurality of component codes in the original base matrix by the processor to form an extended base matrix, the non-zero component is replaced by the plurality of permutation matrices and the zero component is replaced by an all-zero matrix; forming a plurality of permutation matrices by the processor, the plurality of permutation matrices being obtained by conducting the random row shift or the random column shift to an identity matrix; replacing the plurality of component codes in the extended base matrix by the processor to form an extended low-density parity-check matrix, the non-zero component being replaced by the plurality of permutation matrices and the zero component being replaced by the all-zero matrix; adjusting a code length and a code rate of the extended low-density parity-check matrix and forming an adjusted low-density parity-check matrix; and outputting the adjusted base matrix by an output device.

Preferably, the random row shift may include a cyclic shift to each row with a predetermined number of rows, or the random column shift may include the cyclic shift to each column with a predetermined number of columns.

Preferably, the plurality of replacement matrices may include a fixed replacement matrix obtained by conducting a preset number row shift or a preset number column shift to the diagonal matrix of the non-zero component, and the non-zero component located in a predetermined block of the original base matrix is replaced by the fixed replacement matrix.

Preferably, the code length and the code rate may be adjusted by shortening the extended base matrix or puncturing the extended base matrix.

Preferably, the low-density parity-check code scaling method may further include the following step of: masking the extended base matrix by setting a part of the non-zero component to zero.

As mentioned previously, the low-density parity-check code scaling method in accordance with the present disclosure may have one or more advantages as follows.

1. The low-density parity-check code scaling method may provide a highly structured low-density parity-check matrix design, which can be performed by using the array dispersion method for constructing the big block codes from the smaller block codes.

2. The low-density parity-check code scaling method is capable of combining multiple independent and shorter block codes for obtaining the bigger block codes, so that the decoding can be performed separately to the smaller block code, or to the complete block code.

3. The low-density parity-check code scaling method is capable of solving the compatible problem between the old and new systems and the schedule of new system development can be shortened to improve the development efficiency.

BRIEF DESCRIPTION OF THE DRAWINGS

FIG. 3 is the schematic diagram of replacing the component codes of the original low-density parity-check matrix in accordance with the present disclosure.

FIG. 6 is the schematic diagram of replacing the component codes of the original base matrix in accordance with the present disclosure.

DETAILED DESCRIPTION OF THE PREFERRED EMBODIMENTS

In order to facilitate the understanding of the technical features, the contents and the advantages of the present disclosure, and the effectiveness thereof that can be achieved, the present disclosure will be illustrated in detail below through embodiments with reference to the accompanying drawings. On the other hand, the diagrams used herein are merely intended to be schematic and auxiliary to the specification, but are not necessary to be true scale and precise configuration after implementing the present disclosure. Thus, it should not be interpreted in accordance with the scale and the configuration of the accompanying drawings to limit the scope of the present disclosure on the practical implementation.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Figure 1:
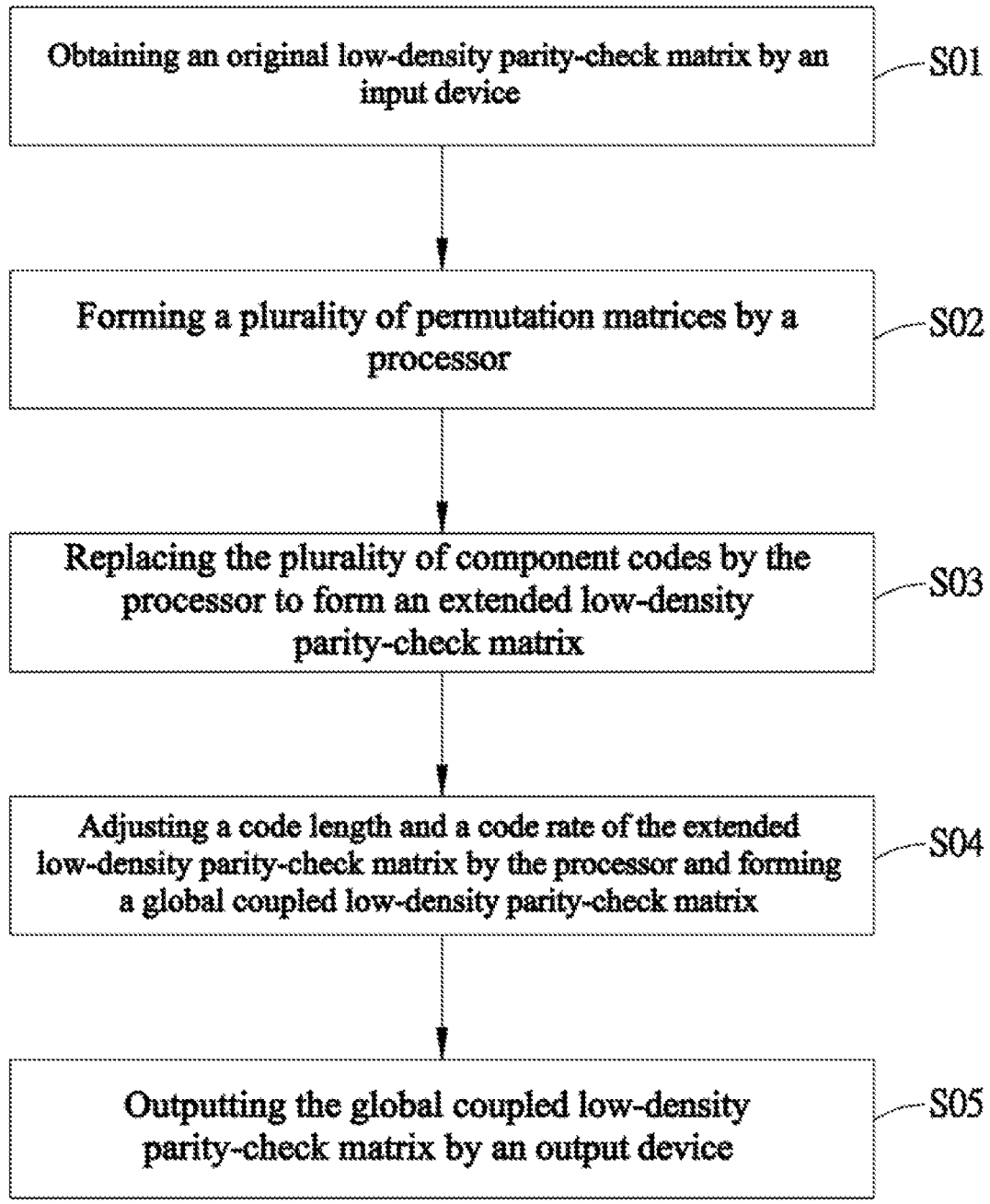
FIG. 1 is a flow chart of a low-density parity-check code scaling method in accordance with the present disclosure.

FIG. 1 is a flow chart of a low-density parity-check code scaling method in accordance with the present disclosure. As shown in the figure, the method includes the following steps (S01-S05). The steps may be conducted by executing a plurality of instructions stored in the memory device.

Step S01: Obtaining an original low-density parity-check matrix by an input device. The low-density parity-check matrix is made by a sparse parity-check matrix and belonged to a block code. The block code includes a plurality of component codes with low-density characteristic, which contains mostly zeros and a few numbers of ones.

Figures 2A, 2B:
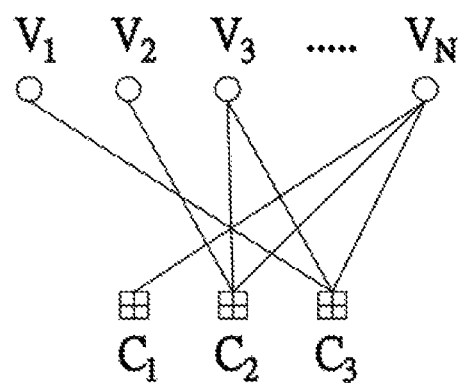
FIG. 2A and FIG. 2B are the schematic diagrams illustrating the original low-density parity-check matrix and the Tanner graph thereof in accordance with the present disclosure.

Please refer to FIG. 2A and FIG. 2B, which are the schematic diagrams illustrating the original low-density parity-check matrix and the Tanner graph thereof in accordance with the present disclosure. As shown in FIG. 2A, the original low-density parity-check matrix $H_0$ demonstrates an M×N matrix with M rows and N columns. The number of the rows represents the number of the check nodes and the number of the columns represents the number of the variable nodes. In the present embodiment, the original low-density parity-check matrix $H_0$ has 3 check nodes. The component code "one" means that the check node is connected to the variable node. The connection relationship between the check nodes and the variable nodes can be demonstrated by a Tanner graph. As shown in FIG. 2B, the Tanner graph shows the relationship between the 3 check nodes ($C_1$-$C_3$) and N variable nodes ($V_1$-$V_n$).

The component codes of the original low-density parity-check matrix can be randomly selected. However, the present disclosure is not limited in such method. The other methods for generating the low-density parity-check matrix should be included in the present disclosure. In addition, the original low-density parity-check matrix may be obtained by the input device. That is, the input device includes the input interfaces such as keyboards, mice, touch devices and the user may operate the above device to access the matrix file stored in the memory or in the software program.

Step S02: Forming a plurality of permutation matrices by a processor. The plurality of permutation matrices are obtained by conducting a random row shift or a random column shift to an identity matrix. In other words, each rows (or each column) of the identity matrix can be moved randomly and the above movement still maintain that the square binary matrix has exactly one entry of one component in each row and each column and zero components elsewhere. The identity matrix $\varphi(1)$ is the L×L square matrix with L rows and L columns. The function is denoted as follows:

The identity matrix $$\varphi(1) = \begin{bmatrix} 1 & 0 & & 0 \\ 0 & 1 & \cdots & \vdots \\ \vdots & & \ddots & \vdots \\ 0 & 0 & \cdots & 1 \end{bmatrix}_{L \times L} \quad (1)$$

Based on the above identity matrix, the L rows or the L columns can be shifted randomly and the plurality of permutation matrices can be obtained accordingly. The permutation matrices only have one in each row and each column. The steps of the row shift or the column shift may be conducted by the processor. The processor includes central processing unit, microprocessor, graphic processor, and so on. The instructions of the computer system may provide the above shifting steps to the identity matrix, so as to form the different permutation matrices.

In other embodiment, the random row shift or the random column shift may be performed in a specific method. That is, each row of the identity matrix is sequentially moved to the next row. Similarly, the method may also move each column to the next column. The plurality of permutation matrices are obtained by a cyclic shift to each row or the cyclic shift to each column. The cyclic displacement is not limited in single row or single column. The number of the shifting row or the shifting column may be a fixed value or a random generated number. The permutation matrix $\Phi(1)$ is formed by the cyclic shift to the L×L identity matrix $\varphi(1)$ with l rows or l columns. The relationship is denoted as follows:

$$\text{cyclic shift}(\varphi(1), l) = \begin{bmatrix} 0 & \cdots & 1 & 0 & & 0 & \cdots & 0 \\ 0 & \cdots & 0 & 1 & \cdots & \vdots & \cdots & 0 \\ \vdots & & \vdots & & \ddots & \vdots & & \vdots \\ 0 & \cdots & \cdots & 0 & \cdots & 1 & \cdots & 0 \end{bmatrix}_{L \times L} \quad (2)$$

The permutation matrix $$\Phi(1) \in \{\text{cyclic shift}(\varphi(1), l), l=0, 1, \ldots, L-1\} \quad (3)$$

Step S03: Replacing the plurality of component codes by the processor to form an extended low-density parity-check matrix. Since the plurality of permutation matrices are obtained, the original low-density parity-check matrix can be extended by replacing the component codes of the original low-density parity-check matrix. The ones are replaced by the plurality of permutation matrices and the zeros are replaced by an all-zero matrix. In the present embodiment, the original low-density parity-check matrix is the M×N matrix and the plurality of permutation matrices are L×L square matrix. When the component codes are replaced, the extended low-density parity-check matrix is scaled up to a ML×NL matrix. The dimension of the permutation matrix can be adjusted to achieve the expected size of the low-density parity-check matrix.

Please refer to FIG. 3, which is the schematic diagram of replacing the component codes of the original low-density parity-check matrix in accordance with the present disclosure. As shown in the figure, the original low-density parity-check matrix $H_0$ provides 3 rows and N columns and contains several one components 11 and zero components 13. The dimension L of the permutation matrices is set on 2 and the two permutation matrices 12a, 12b are formed by randomly shifting the rows or the columns of the 2×2 square matrix. The ones components 11 in the original low-density parity-check matrix are replaced by the permutation matrices 12a, 12b and the zero components 13 in the original low-density parity-check matrix are replaced by the all-zero matrix 14. The replacement to the ones can be randomly selected from the two permutation matrices 12a, 12b. In other circumstance, the predetermined block, for example the third row of the original low-density parity-check matrix $H_0$, can be replaced by the same permutation matrix 12a. The fixed permutation matrix may provide the specific structure of the low-density parity-check matrix. Thus, the extended low-density parity-check matrix $H_1$ is obtained and the dimension of the new matrix is scaled up. In the present embodiment, the extended low-density parity-check matrix $H_1$ is scaled up to 6 rows and 2N columns. However, the extended dimension is not limited in 2, the other dimension can be used to achieve the desired rows and columns of the extended low-density parity-check matrix.

Step S04: Adjusting a code length and a code rate of the extended low-density parity-check matrix by the processor and forming a global coupled low-density parity-check matrix. In the previous steps, the original low-density parity-check matrix is extended by replacing the component codes with the permutation matrices and the all-zero matrix. Since the above matrices used to replace the original codes are L×L square matrix, the dimension of the extended low-density parity-check matrix may be formed as ML×NL matrix. However, the desired length of the low-density parity-check matrix may not be exactly the same. Therefore, the code length and the code rate of the extended low-density parity-check matrix may further adjust to match the final requirement.

In the present embodiment, the adjustment is performed by shortening the extended low-density parity-check matrix or puncturing the extended low-density parity-check matrix. The shortening method means that a part of the columns in the extended low-density parity-check matrix is deleted. The number of the columns is reduced, so as to decrease the code length of the extended low-density parity-check matrix. Since the code length is decreased, the code rate is also changed. On the other hand, the puncturing method means that a part of the rows in the extended low-density parity-check matrix is deleted. The puncturing method may not change the code length. However, the data length is changed during the puncturing. Thus, the code rate can be adjusted accordingly. Based on the above adjustment, the global coupled low-density parity-check matrix is obtained with specific design to the code length and code rate.

In addition, the adjusting step may further include the process of masking the extended low-density parity-check matrix. The masking process means that a part of the ones components in the extended low-density parity-check matrix can be set to zero. The reason for doing such adjustment is to prevent the short cycle occurred at the extended check nodes and variable nodes. Therefore, the error correcting ability of the block codes and the calculation efficiency can be improved. The masking process may be executed before or after the above adjustment step. In other words, the masking process may perform the adjustment to the extended low-density parity-check matrix or to the global coupled low-density parity-check matrix.

Step S05: Outputting the global coupled low-density parity-check matrix by an output device. The previous steps provide the scaling method to the original low-density parity-check matrix and form the global coupled low-density parity-check matrix with desire code length and code rate. The processing and calculation are performed by the processor through a series of instructions. When the global coupled low-density parity-check matrix is obtained, the final result is output by the output device. The output device includes the output interfaces, for example the display panel, the transmitter, and so on. The output device may further connect to an encoder and a decoder, and the extended matrix with bigger block codes can be transmitted thereto.

The bigger block code may provide the better error correcting ability. Based on the scaling method disclosed in the present disclosure, the complexity of designing the big block code and the corresponded encoding or decoding hardware may become easier. The communication system uses big block code for transmitting the data, and the non-volatile memory, like NAND flash memory, uses big block code for protecting the data. In addition, the satellite transmission, the internet or cable system, the TV broadcasting system may also use the low-density parity-check code as the transmitting standards. Based on the above steps to obtain the bigger block code of the low-density parity-check matrix through the array dispersion, the old codes design can be preserved so that the new codes are compatible to the old system. Thus, the new product development and verifying schedule can be reduced.

Figure 4A:
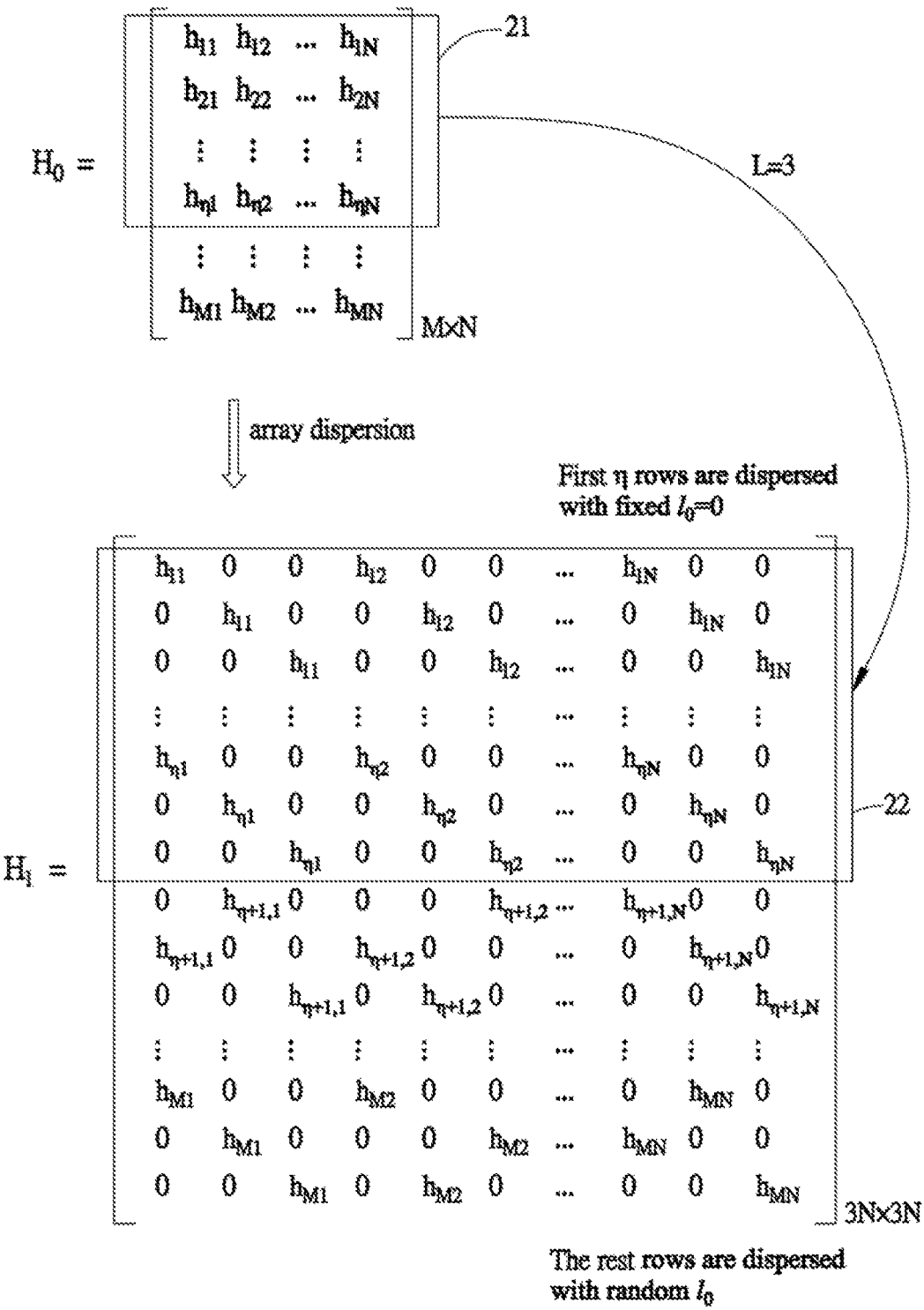
FIG. 4A and FIG. 4B are the schematic diagrams illustrating the specific block design for replacing the component codes and the Tanner graph thereof in accordance with the present disclosure.
Figure 4B:
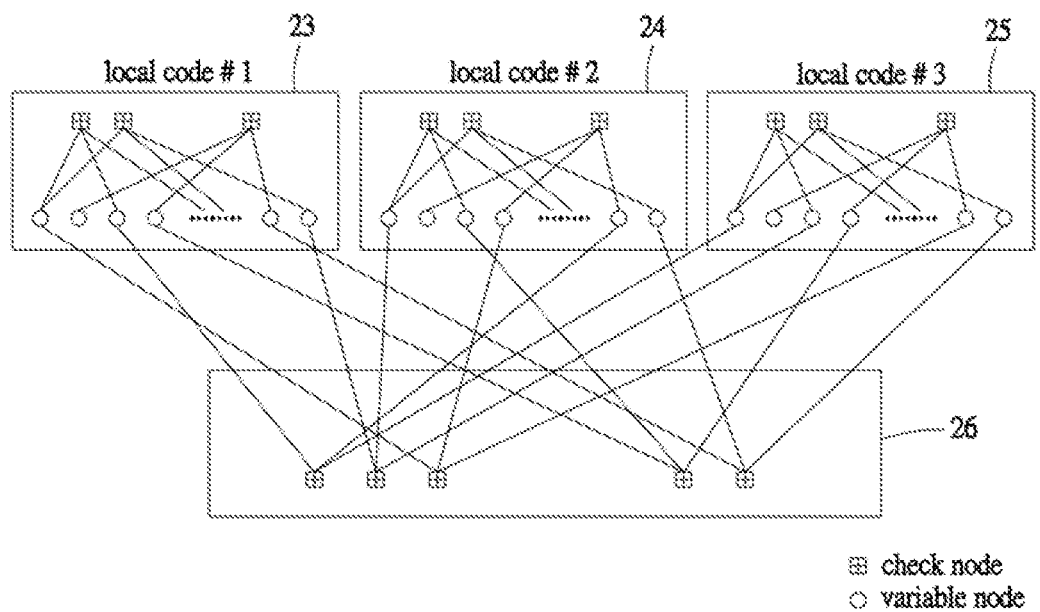

Please refer to FIG. 4A and FIG. 4B, which are the schematic diagrams illustrating the specific block design for replacing the component codes and the Tanner graph thereof in accordance with the present disclosure. As shown in FIG. 4A, the original low-density parity-check matrix $H_0$ demonstrates an M×N matrix with M rows and N columns. The component codes ($h_{11}$ to $h_{MN}$) in the matrix contain ones and zeros. In the present embodiment, the predetermined block 21 means the first η rows, which are selected from the M rows. The component codes in the predetermined block 21 are replaced by a fixed permutation matrix. That is, the fixed permutation matrix may be a 3×3 identity matrix $\varphi(1)$ without shifting the rows or columns. Thus, the predetermined block 21 is dispersed to an 3η×3N block 22 as illustrated in the figure. In addition, the rest rows in the original low-density parity-check matrix $H_0$ are also dispersed by replacing the component codes with the permutation matrices, which are formed by randomly shifting the columns or the rows of the identity matrix $\varphi(1)$.

Based on the similar steps S02 to S04 described in the previous embodiment, the extended low-density parity-check matrix $H_1$ is obtained. The specific sequence to the extended matrix can be transformed to the Tanner graph. As shown in FIG. 4B, the block 22 is treated as the combination of three local block codes 23, 24, 25. Each of the three local block codes 23, 24, 25 can decode independently and in parallel. The rest rows are shown as globally connected codes 26 with globally connected check nodes. The present embodiment shows the first η rows are selected to form the predetermined block. However, the present disclosure is not limited in such rows. The number of the selected rows can be modified to achieve the different code structure. Therefore, the different block structures should also be included in the present disclosure.

The following paragraphs will describe the process of the low-density parity-check code scaling method in accordance with another embodiment.

Figure 5:
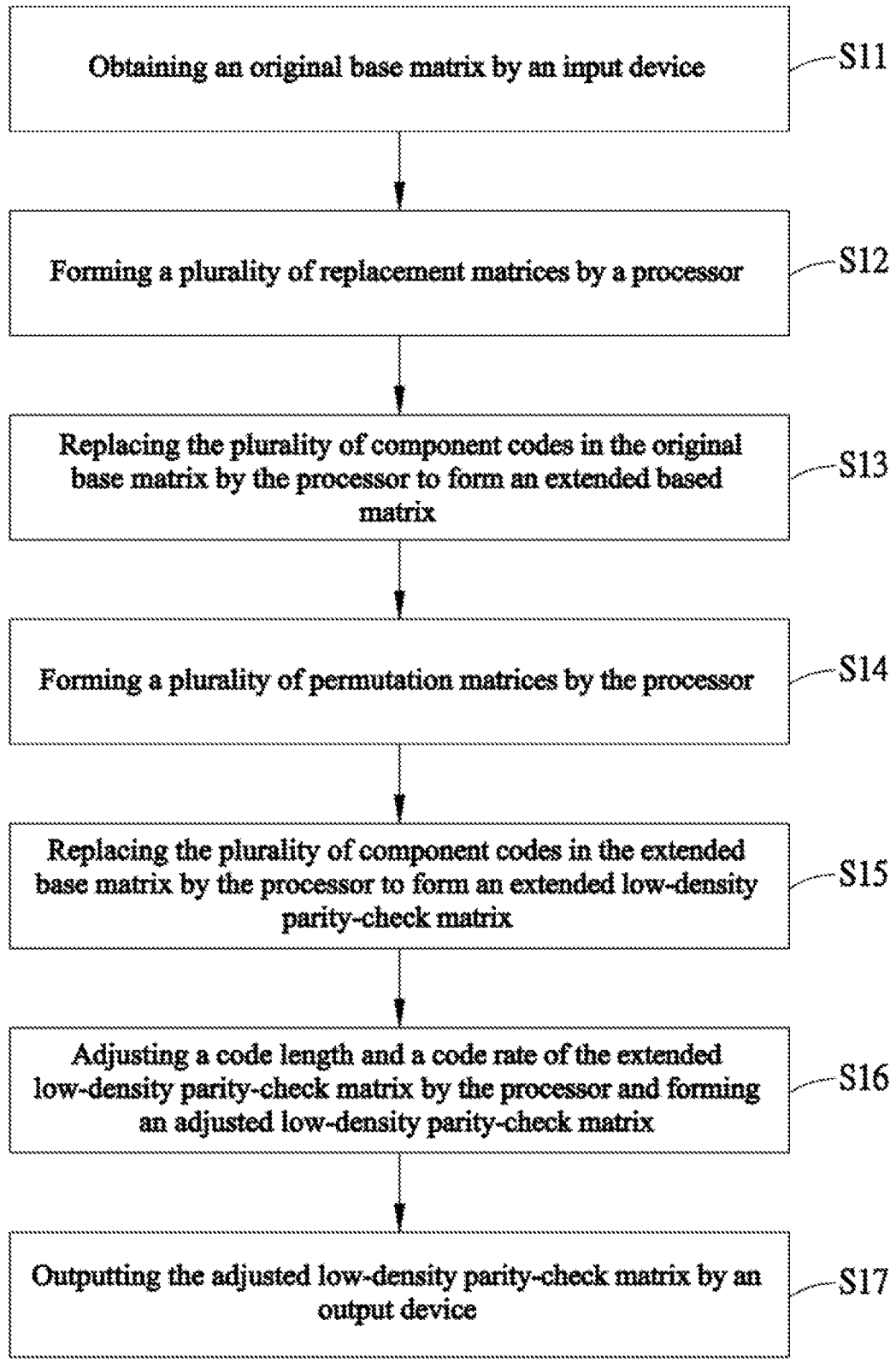
FIG. 5 is a flow chart of another low-density parity-check code scaling method in accordance with the present disclosure.

FIG. 5 is a flow chart of another low-density parity-check code scaling method in accordance with the present disclosure. As shown in the figure, the method includes the following steps (S11-S17). The steps may be conducted by executing a plurality of instructions stored in the memory device.

Step S11: Obtaining an original base matrix by an input device. The original base matrix is made by the elements belonged to the finite field. The original base matrix can be formed by several methods. However, the present application is not limited in the specific method. The input device is similar to the previous embodiment, so that the duplicate details are no longer given herein.

Please refer to FIG. 6, which is the schematic diagram of replacing the component codes of the original base matrix in accordance with the present disclosure. As shown in FIG. 6, the original base matrix $B_0$ is disclosed. The number of the rows represents the number of the check nodes and the number of the columns represents the number of the variable nodes. The component codes are divided into a non-zero component and a zero component. The non-zero component means that the elements belonged to the numbers in the finite field. In the present embodiment, the numbers of the finite field is 13. Since the size is set in 13, the elements of the original base matrix are represented by non-zero components $\beta^0$, $\beta^1$ . . . $\beta^{12}$. The original base matrix $B_0$ is demonstrated by the matrix shown in FIG. 6.

Step S12: Forming a plurality of replacement matrices by a processor. The plurality of replacement matrices are obtained by conducting a random row shift or a random column shift to a diagonal matrix of the non-zero component. In other words, each rows (or each column) of the square diagonal matrix can be moved randomly and the above movement still maintain that the square binary matrix has exactly one entry of the non-zero component in each row and each column and zero components elsewhere. The identity matrix $\varphi(\beta^x)$ is the L×L square matrix with L rows and L columns. The function is denoted as follows:

The identity matrix $$\varphi(\beta^x) = \begin{bmatrix} \beta^x & 0 & & 0 \\ 0 & \beta^x & \cdots & \vdots \\ \vdots & & \ddots & \vdots \\ 0 & 0 & \cdots & \beta^x \end{bmatrix}_{L \times L} \quad (1)$$

Based on the above identity matrix, the L rows or the L columns can be shifted randomly and the plurality of replacement matrices can be obtained accordingly. The replacement matrices only have the non-zero component in each row and each column. The steps of the row shift or the column shift may be conducted by the processor. The processor includes central processing unit, microprocessor, graphic processor, and so on. The instructions of the computer system may provide the above shifting steps to the identity matrix, so as to form the different replacement matrices.

In other embodiment, the random row shift or the random column shift may be performed in a specific method. That is, each row of the identity matrix is sequentially moved to the next row. Similarly, the method may also move each column to the next column. The plurality of replacement matrices are obtained by a cyclic shift to each row or the cyclic shift to each column. The cyclic displacement is not limited in single row or single column. The number of the shifting row or the shifting column may be a fixed value or a random generated number. The replacement matrix $\Phi(x)$ may perform the cyclic shift to the L×L identity matrix φ(x) with l rows or l columns. The relationship is denoted as follows:

$$\text{cyclic shift}(\varphi(x), l) = \begin{bmatrix} 0 & \cdots & x & 0 & & 0 & \cdots & 0 \\ 0 & \cdots & 0 & x & \cdots & \vdots & & 0 \\ \vdots & \vdots & & \vdots & \ddots & \vdots & \vdots & \vdots \\ 0 & \cdots & \cdots & 0 & \cdots & x & \cdots & 0 \end{bmatrix}_{L \times L} \quad (5)$$

The replacement matrix $$\Phi(x) \in \{\text{cyclic shift}(\varphi(x), l), l=0,1,\ldots,L-1\} \quad (6)$$

Step S13: Replacing the plurality of component codes in the original base matrix by the processor to form an extended based matrix. Since the plurality of replacement matrices are obtained, the component codes of the original base matrix can be replaced. The non-zero components are replaced by the plurality of replacement matrices and the zero components are replaced by an all-zero matrix. When the original base matrix is the r×s matrix and the plurality of replacement matrices are L×L square matrix, the extended base matrix is scaled up to a rL×sL matrix. The dimension of the permutation matrix can be adjusted to achieve the expected size of the low-density parity-check matrix.

Referring to FIG. 6 again, the original base matrix $B_0$ provides 3 rows and s columns and contains several components $\beta^0, \beta^1 \ldots \beta^{12}$. The dimension L of the replacement matrices is set on 2 and the replacement matrices are formed by randomly shifting the rows or the columns of the 2×2 square matrix. For example, the non-zero components 31, 33 in the original base matrix are replaced by the replacement matrices 32, 34 respectively. Thus, the extended base matrix $A_0$ is obtained and the dimension of the new matrix is scaled up. In the present embodiment, the extended base matrix $A_0$ is extended to 6 rows and 2s columns. However, the extended dimension is not limited in 2, the other dimension can be used to achieve the desired rows and columns of the extended base matrix.

Step S14: Forming a plurality of permutation matrices by the processor. The plurality of permutation matrices are obtained by conducting a random row shift or a random column shift to the identity matrix. The generating method of the permutation matrices is similar to that of the replacement matrices. Thus, the duplicate details are omitted.

Step S15: replacing the plurality of component codes in the extended base matrix by the processor to form an extended low-density parity-check matrix. Similar to step S13, the non-zero components are replaced by the plurality of permutation matrices and the zero components are replaced by an all-zero matrix. When the permutation matrices are made by a Z×Z matrix, the extended low-density parity-check matrix is scaled up to an rZL×sZL matrix.

Step S16: Adjusting a code length and a code rate of the extended low-density parity-check matrix by the processor and forming an adjusted low-density parity-check matrix. In the previous steps, the original base matrix is extended by replacing the component codes with the replacement matrices and the all-zero matrix and the extended base matrix is further extended by replacing the component codes with the permutation matrices and the all-zero matrix. Since the replacement matrices and the permutation matrices are square matrix, the dimension of the extended low-density parity-check matrix may be formed as rZL×sZL matrix. However, the desired length of the low-density parity-check matrix may not be exactly the same. Therefore, the code length and the code rate of the extended low-density parity-check matrix may further adjust to match the final requirement.

In the present embodiment, the adjustment is performed by shortening the extended low-density parity-check matrix or puncturing the extended low-density parity-check matrix. The shortening method means that a part of the columns in the extended low-density parity-check matrix is deleted. The puncturing method means that a part of the rows in the extended low-density parity-check matrix is deleted. Based on the above adjustment, the adjusted low-density parity-check is obtained with specific design to the code length and code rate.

In addition, the adjusting step may further include the process of masking the extended base matrix. The masking process means that a part of the ones components in the extended base matrix can be set to zero. The reason for doing such adjustment is to prevent the short cycle occurred at the extended check nodes and variable nodes. Therefore, the error correcting ability of the block codes and the calculation efficiency can be improved. The masking process may also be executed to the extended low-density parity-check matrix. In other words, the masking process may perform the adjustment to both the extended base matrix and the extended low-density parity-check matrix.

Step S17: Outputting the adjusted low-density parity-check matrix by an output device. The previous steps provide the scaling method to the original base matrix and form the adjusted low-density parity-check matrix with desire code length and code rate. The processing and calculation are performed by the processor through a series of instructions. When the adjusted low-density parity-check matrix is obtained, the final result is output by the output device. The output device includes the output interfaces, for example the display panel, the transmitter, and so on. The output device may further connect to the encoder and the decoder, and the extended matrix with bigger block codes can be transmitted thereto.

The bigger block code may provide the better error correcting ability. Based on the scaling method disclosed in the present disclosure, the complexity of designing the big block code and the corresponded encoding or decoding hardware may become easier. The communication system uses big block code for transmitting the data, and the non-volatile memory, like NAND flash memory, uses big block code for protecting the data. Based on the above steps to obtain the bigger block code of the low-density parity-check matrix through the array dispersion, the old codes design can be preserved so that the new codes are compatible to the old system. In addition, the new product development and verifying schedule can be reduced.

Similar to the embodiment described in FIG. 4A and FIG. 4B, the original base matrix $B_0$ may also select the predetermined block with the first η rows. The component codes in the predetermined block are replaced by a fixed replacement matrix. For example, the fixed replacement matrix may be a 3×3 identity matrix $\varphi(\beta^x)$ without shifting the rows or columns. Thus, the predetermined block is dispersed to 3η rows similar to FIG. 4A. In addition, the rest rows in the original base matrix $B_0$ are also dispersed by replacing the component codes with the replacement matrices, which are formed by randomly shifting the columns or the rows of the identity matrix $\varphi(\beta^x)$.

After the similar steps S12 to S15 described in the previous embodiment, the extended low-density parity-check matrix is obtained. The specific structure of the extended low-density parity-check matrix can be modified by selecting the different kinds of the predetermined block. In addition, this specific structure matrix may adjust the code length and the code rate by shortening or puncturing. The adjusted matrix may also conduct the masking process to prevent the short cycle. Then the adjusted low-density parity-check matrix and the desired low-density parity-check code can be output and transferred to the encoder and decoder.

While the means of specific embodiments in present disclosure has been described by reference drawings, numerous modifications and variations could be made thereto by those skilled in the art without departing from the scope and spirit of the disclosure set forth in the claims. The modifications and variations should in a range limited by the specification of the present disclosure.

What is claimed is:

1. A low-density parity-check code scaling method, comprising following steps of:

obtaining an original low-density parity-check matrix by an input device, the original low-density parity-check matrix comprising a plurality of component codes consisted of ones and zeros;

forming a plurality of permutation matrices by a processor, the plurality of permutation matrices being obtained by conducting a random row shift or a random column shift to an identity matrix, wherein a number of a shifting row or a shifting column is a random generated number;

replacing the plurality of component codes by the processor to form an extended low-density parity-check matrix, the ones being replaced by the plurality of permutation matrices and the zeros being replaced by an all-zero matrix, wherein each of the ones in partial rows of the original low-density parity-check matrix is replaced by a random one of the plurality of permutation matrices, and each of ones in other rows of the original low-density parity-check matrix is replaced by a predetermined one of the plurality of permutation matrices;

adjusting a code length and a code rate of the extended low-density parity-check matrix by the processor and forming a global coupled low-density parity-check matrix; and outputting the global coupled low-density parity-check matrix by an output device.

2. The low-density parity-check code scaling method of claim 1, wherein the code length and the code rate are adjusted by shortening the extended low-density parity-check matrix or puncturing the extended low-density parity-check matrix.

3. The low-density parity-check code scaling method of claim 1, further comprising the following step of:

masking the extended low-density parity-check matrix by setting a part of the ones to zero.

4. A low-density parity-check code scaling method, comprising following steps of:

obtaining an original base matrix by an input device, the original base matrix comprising a plurality of component codes formed by a non-zero component and a zero component;

forming a plurality of replacement matrices by a processor, the plurality of replacement matrices being obtained by conducting a random row shift or a random column shift to a diagonal matrix of the non-zero component, wherein a number of a shifting row or a shifting column is a random generated number;

replacing the plurality of component codes in the original base matrix by the processor to form an extended base matrix, the non-zero component being replaced by the plurality of replacement matrices and the zero component being replaced by an all-zero matrix, wherein each of the component codes in partial rows of the original base matrix is replaced by a random one of the plurality of replacement matrices, and each of the component codes in other rows of the original base matrix is replaced by a predetermined one of the plurality of replacement matrices;

forming a plurality of permutation matrices by the processor, the plurality of permutation matrices being obtained by conducting the random row shift or the random column shift to an identity matrix, wherein a number of a shifting row or a shifting column is a random generated number;

replacing the plurality of component codes in the extended base matrix by the processor to form an extended low-density parity-check matrix, the non-zero component being replaced by the plurality of permutation matrices and the zero component being replaced by the all-zero matrix, wherein each of the component codes in partial rows of the extended base matrix is replaced by a random one of the plurality of permutation matrices, and each of the component codes in other rows of the extended base matrix is replaced by a predetermined one of the plurality of permutation matrices;

adjusting a code length and a code rate of the extended low-density parity-check matrix by the processor and forming an adjusted low-density parity-check matrix; and outputting the adjusted low-density parity-check matrix by an output device;

wherein, the plurality of permutation matrices are obtained by conducting a random row shift or a random column shift to an identity matrix; and the plurality of replacement matrices are obtained by conducting a random row shift or a random column shift to a diagonal matrix of the non-zero component.

5. The low-density parity-check code scaling method of claim 4, wherein the code length and the code rate are adjusted by shortening the extended base matrix or puncturing the extended base matrix.

6. The low-density parity-check code scaling method of claim 4, further comprising the following step of:

masking the extended base matrix by setting a part of the non-zero component to zero.

* * * * *